(12) United States Patent
Sato

(10) Patent No.: US 8,338,822 B2
(45) Date of Patent: Dec. 25, 2012

(54) ELECTRICAL CONNECTION STRUCTURE HAVING ELONGATED CARBON STRUCTURES WITH FINE CATALYST PARTICLE LAYER

(75) Inventor: Shintaro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/280,269

(22) Filed: Nov. 17, 2005

(65) Prior Publication Data

US 2006/0286851 A1    Dec. 21, 2006

(30) Foreign Application Priority Data

Jun. 6, 2005   (JP) ................................. 2005-165004

(51) Int. Cl.
H01L 35/24    (2006.01)
(52) U.S. Cl. ... 257/40; 977/742; 977/746; 257/E23.074; 257/E23.165
(58) Field of Classification Search .............. 257/77, 257/40, E23.074, E23.165; 977/742, 746
See application file for complete search history.

(56) References Cited

U.S. PATENT DOCUMENTS

| 6,596,187 | B2 * | 7/2003 | Coll et al. .................. 216/56 |
| 2002/0163079 | A1 | 11/2002 | Awano ........................ 257/750 |
| 2003/0179559 | A1 * | 9/2003 | Engelhardt et al. .......... 361/780 |
| 2004/0192151 | A1 * | 9/2004 | Tsukamoto et al. ........... 445/50 |
| 2005/0001529 | A1 * | 1/2005 | Kang et al. .................. 313/310 |
| 2005/0189655 | A1 * | 9/2005 | Furukawa et al. ............ 257/762 |
| 2005/0215049 | A1 * | 9/2005 | Horibe et al. ................ 438/622 |
| 2006/0091557 | A1 | 5/2006 | Sakamoto et al. ............ 257/774 |

FOREIGN PATENT DOCUMENTS

| JP | 2002-329723 | 11/2002 |
| JP | 2003-288833 | 10/2003 |
| JP | 2004-284919 | 10/2004 |
| JP | 2004-288833 | 10/2004 |
| JP | 2005-22885 | 1/2005 |
| JP | 2005-22886 | 1/2005 |
| WO | WO 2004/051726 A1 | 6/2004 |

OTHER PUBLICATIONS

Sato et. al. "Growth of diameter-controlled carbon nanotubes using monodisperse nickel nanoparticles obtained with a differential mobility analyzer" 2003 Chemical Physics Letters (382 (2003) 361-366).*

Office Action dated Nov. 10, 2009 corresponding to Japanese patent application No. 2005-165004 with English translation.

Office Action dated Mar. 16, 2010 issued in a corresponding Japanese Patent Application No. 2005-165004 with English translation.

* cited by examiner

*Primary Examiner* — Wael M Fahmy
*Assistant Examiner* — Sarah Salerno
(74) *Attorney, Agent, or Firm* — Kratz, Quintos & Hanson, LLP

(57) ABSTRACT

An electrical connection structure having elongated carbon structures electrically connected to an electroconductive body is obtained by successively layering an electroconductive catalyst support layer, a fine catalyst particle layer for producing the elongated carbon structures and the elongated carbon structures on the electroconductive body. A low-resistance electrical connection structure is provided.

11 Claims, 10 Drawing Sheets

ELECTRICAL CONNECTION STRUCTURE HAVING ELONGATED CARBON STRUCTURES WITH FINE CATALYST PARTICLE LAYER

CROSS-REFERENCE TO RELATED APPLICATIONS

This application is based upon and claims the benefit of priority from the prior Japanese Patent Application No. 2005-165004 filed on Jun. 6, 2005, the entire contents of which are incorporated herein by reference.

BACKGROUND OF THE INVENTION

1. Field of the Invention

The present invention relates to an electrical connection structure, a manufacturing method thereof and a semiconductor integrated circuit device, more particularly to an electrical connection structure using elongated carbon structures such as carbon nanotubes, a manufacturing method thereof and a semiconductor integrated circuit device.

2. Description of the Related Art

In semiconductor integrated circuit devices including semiconductor devices and printed circuit boards, via structures are widely applied in which electroconductive materials are formed in via holes installed in the interlayer insulating films, substrates and the like in order to electrically connect wires and other electrical conductors present in different layers or planes.

Copper (Cu) is often used as a wiring material, and via holes which have been formed at specific positions so as to communicate with such copper wiring are generally filled with an electroconductive metal material such as Cu in order to form vias.

In recent years, research has been done into using so-called carbon nanotubes (CNTs) or cylindrical carbon materials found in carbon fibers for such vias in addition to metal materials such as Cu. In particular, many characteristics of CNTs such as excellent chemical stability and unique physical and electrical properties have made them a focus of interest as materials for forming semiconductor devices, and, besides controlling of their thickness and length, for example, a variety of studies are continuing including controlling of their formation positions and chirality.

FIG. 1 shows one example of a wiring-and-via structure using such CNTs (see for example Japanese Patent Application Laid-open No. 2002-329723 (Claims) and Nihei et al, *Japan Journal of Applied Physics*, 2005, vol. 44, p. 1626). As shown in FIG. 1, such a via structure can be prepared for example by providing an underlayer 2 and a Cu wiring layer 3 on a substrate 1, depositing a barrier film 4 (a Ta film or the like) on the Cu wiring layer 3 to prevent Cu diffusion, forming an insulating layer 5 thereupon, forming via holes and depositing a catalytic metal support film 6 (a Ti film or the like) and a catalytic metal film 7 of Co or the like therein by a method such as sputtering, and then growing CNTs 8 by a method such as thermal CVD (chemical vapor deposition) using hydrocarbon gas ($CH_4$, $C_2H_2$ or the like), after which the upper wiring is formed.

SUMMARY OF THE INVENTION

It has been found that when CNTs are grown from a sputtered catalyst film as described above, it is difficult to control the size and density of the CNTs, making it difficult to control the properties of the CNT wiring.

To overcome such difficulties, attempts have been made to synthesize them after fine catalyst particles have been produced in advance with a controlled particle size, so that CNTs of a controlled diameter and number are grown therefrom (see for example Japanese Patent Application Laid-open No. 2005-022885 (Claims) and Sato et al, *Chemical Physics Letters*, 2003, vol. 382, p. 361).

In this case, the fine catalyst particles are normally deposited on Ta or other barrier films or on Ti films, which have recently been found to promote growth of CNTs, and the CNTs are grown from these films. FIG. 2 is a photograph showing how CNTs grown from fine cobalt particles on a Ti film deposited at the base of a via hole have extended above the via hole. In FIG. 2 the CNTs can be seen growing at a high density in the via hole, aligning along the axial direction of the via.

However, it has been found that there are still problems to be solved in this case. That is, the resistance of the via wiring as measured with electrodes at the top of and bottom of such a CNT via is several mega-ohms (via size: 2 μm), far higher than the few ohms that was anticipated.

It is an object of the present invention to resolve this problem and provide a low-resistance electrical connection structure in which CNTs or other elongated carbon structures are arranged at high densities. Other objects and advantages of the present invention are made clear in the explanation below.

In one aspect of the present invention, an electrical connection structure having elongated carbon structures electrically connected to an electroconductive body is provided wherein an electroconductive catalyst support layer, a fine catalyst particle layer for producing the elongated carbon structures and the elongated carbon structures themselves are layered successively on the electroconductive body. A low-resistance electrical connection structure is obtained by this aspect of the present invention. Preferably the fine catalyst particle layer is made by depositing fine catalyst particles which have been made into fine particles in advance, on the electroconductive catalyst support layer.

In another aspect of the present invention, a method for manufacturing an electrical connection structure is provided in which an electroconductive catalyst support layer is provided on an electroconductive body, fine catalyst particles which have been made into fine particles in advance are deposited on this electroconductive catalyst support layer to form a fine catalyst particle layer, and elongated carbon structures are provided on the fine catalyst particle layer. With this aspect of the present invention it is possible to manufacture an electrical connection structure with low resistance. The fine catalyst particle layer is preferably formed by irradiating the electroconductive catalyst support layer under a reduced pressure with a beam of fine catalyst particles with a uniform particle size.

In both of the aspects, desirable are that the elongated carbon structures be provided in a via hole, that the electroconductive catalyst support layer be made of an oxidation-resistant substance, that the electroconductive catalyst support layer have a function of promoting growth of the elongated carbon structures, that the electroconductive catalyst support layer have a function of preventing diffusion of a metal making up the electroconductive body, that the fine catalyst particles be fine particles of a metal selected from the group consisting of Co, Ni, Fe, Pd, Pt and alloys comprising these, that the electroconductive catalyst support layer be a HfN film layer, ZrN film layer, TiN film layer or a multilayer film thereof, that the electroconductive catalyst support layer comprise a first layer on the side of the electroconductive body, the first layer having a function of preventing diffusion of a metal making up the electroconductive body and a second layer on the side of the fine catalyst particle layer, the second layer having a function of promoting growth of the elongated carbon structures, and that the first layer be a Ta layer and the second layer be a HfN film layer, ZrN film layer or TiN film layer.

In yet other aspects of the present invention, semiconductor integrated circuit devices are provided having an electrical connection structure according to either of the above-described two aspects. With these aspects of the present invention, highly-integrated semiconductor integrated circuit devices are provided having a low-resistance electrical connection structure and high reliability.

A low-resistance electrical connection structure is provided by the present invention.

DESCRIPTION OF THE PREFERRED EMBODIMENTS

Figure 1:
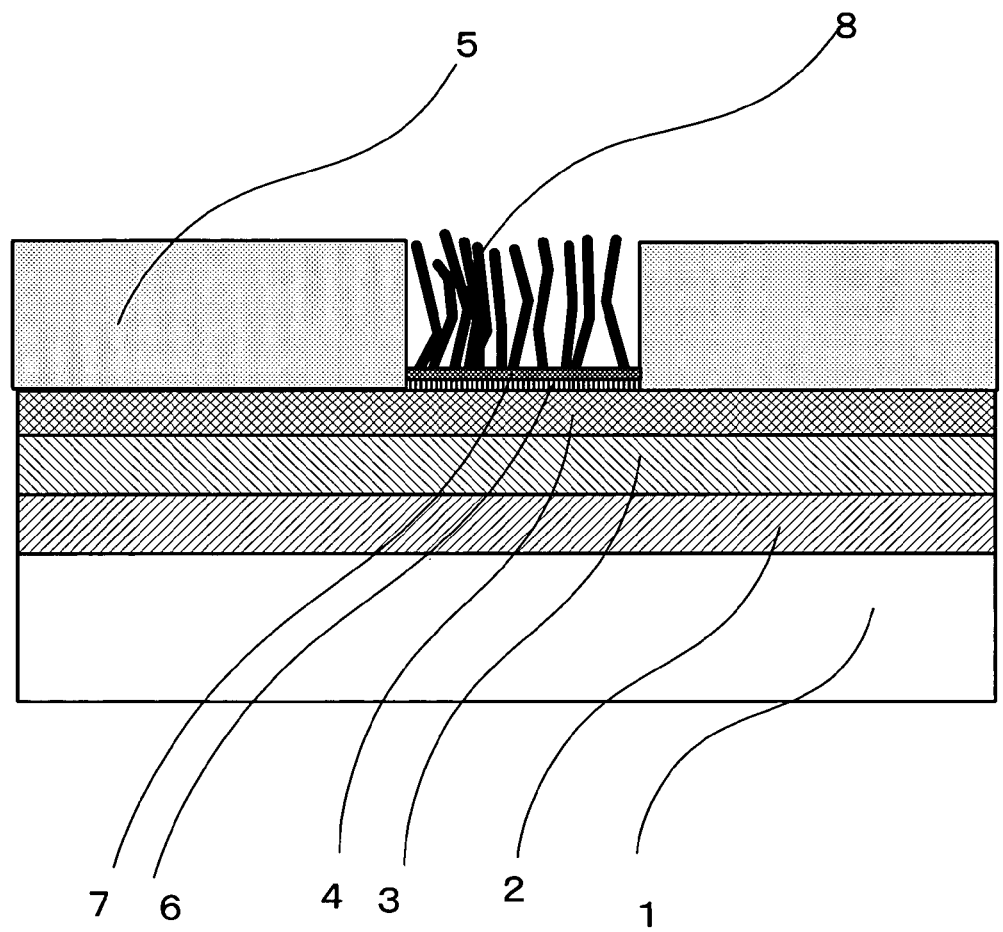
FIG. 1 is a model view showing an electrical connection structure having a via structure using CNTs.
Figure 2:
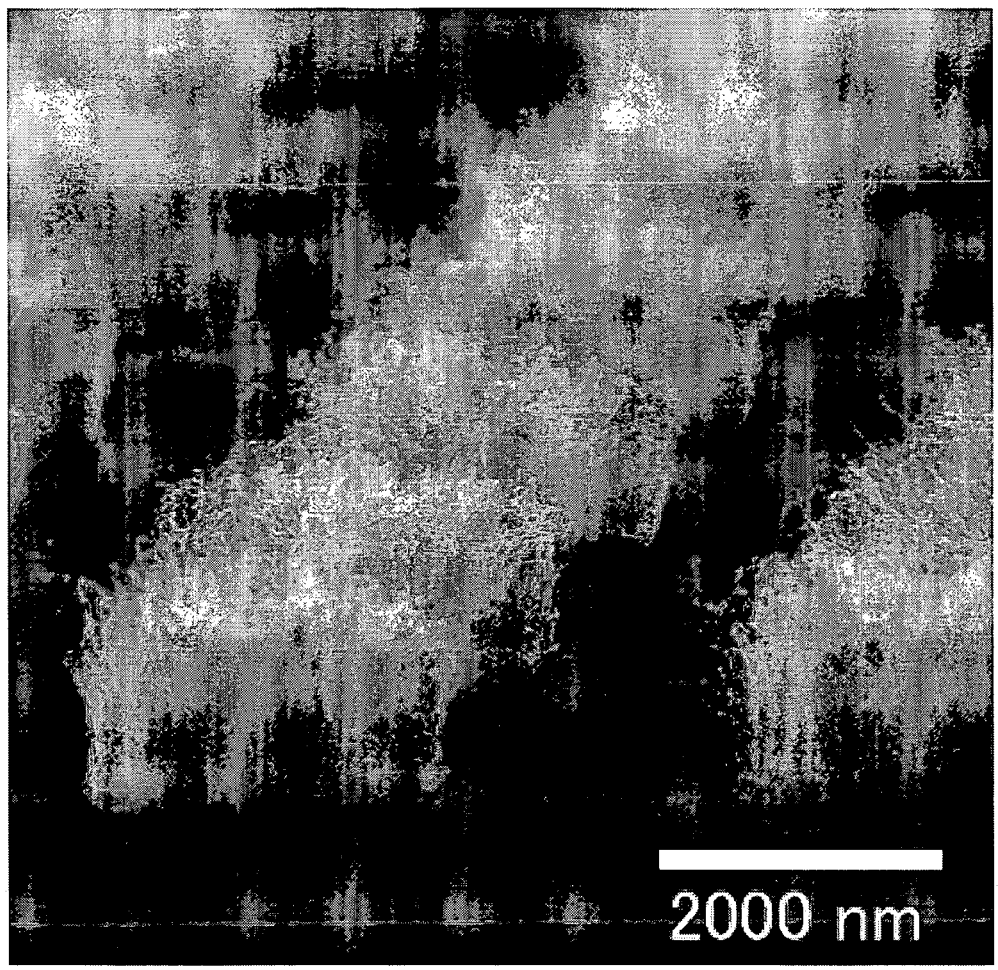
FIG. 2 is a photograph showing CNTs grown from fine cobalt particles on a Ti film deposited at the base of a via hole as they extend above the via hole.

Embodiments of the present invention are explained below using drawings, examples and the like. These drawings, examples and the like and explanations exemplify the present invention and do not limit the scope of the present invention. Of course, other embodiments can be included in the scope of the present invention to the extent that they match the intent of the present invention. Symbols which are identical in the drawings represent identical elements.

The electrical connection structure of the present invention is an electrical connection structure having elongated carbon structures electrically connected to an electroconductive body, in which an electroconductive catalyst support layer, a fine catalyst particle layer for producing the elongated carbon structures and the elongated carbon structures themselves are layered successively on the electroconductive body.

In the present invention an "electroconductive body" is typically a wiring part of a semiconductor integrated circuit device or the like. There are no particular limits on its form as long as it is made of an electroconductive substance capable of being electrically connected to elongated carbon structures. Examples of such electroconductive substances include aluminum, copper, gold, silver, tungsten, polysilicon and the like. There are no particular limits on the thickness of the electroconductive body, but in the case of wiring for a semiconductor integrated circuit device a range of 100 to 1000 nm is common. There are no particular limits on the method of making the electroconductive body of the present invention, and a known method such as plating, sputtering or the like can be selected.

When vertical relationships are discussed here it is understood that the "electroconductive body" is the lowest layer, but even when elongated carbon structures have been formed on a fine catalyst particle layer on top of an electroconductive catalyst support layer in a macroscopic view, some structural part of the electroconductive catalyst support layer may contact the elongated carbon structures directly without the fine catalyst particle layer in between, in a microscopic view as described later. Consequently, vertical relationships in the present invention should be understood to indicate the order in which the layers are formed in a macroscopic view.

Figure 3:
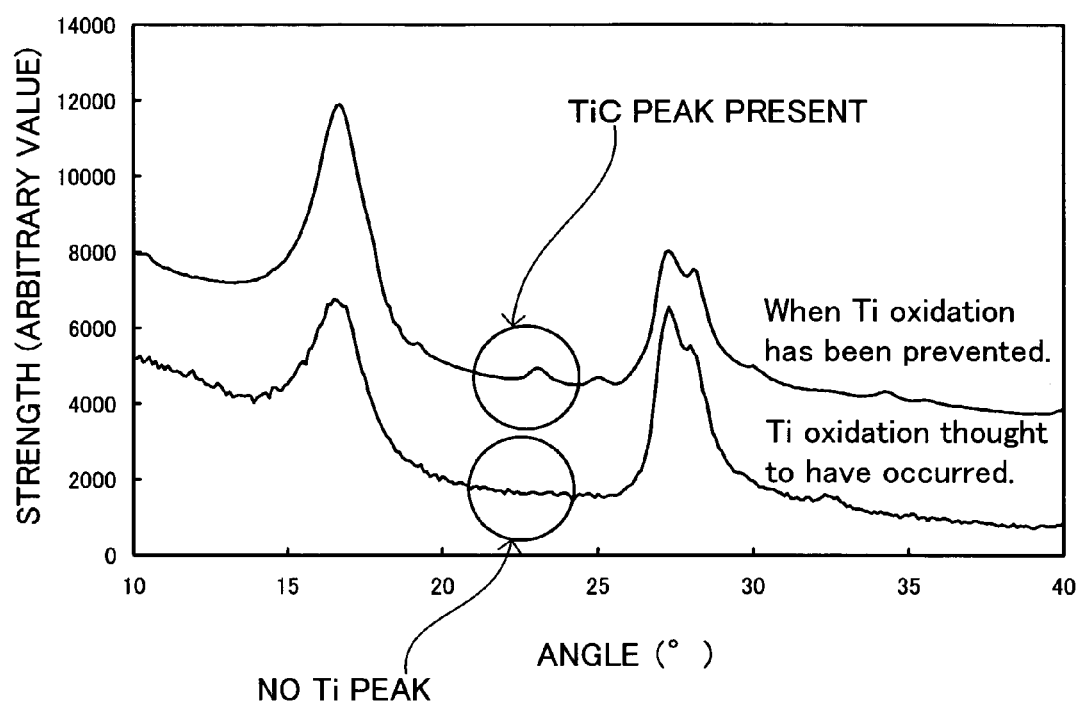
FIG. 3 is an x-ray diffraction chart showing x-ray diffraction results for a CNT growth surface after CNT growth.

It has been shown that one reason for the high resistance of the aforementioned structure of FIG. 1 may be oxidation of the metal film (titanium film) below the fine catalyst particle layer. Normally when fine catalyst particles are deposited on a metal film, the metal film is exposed once to air, and if the metal is easily oxidizable it will be oxidized to some degree. An X-ray diffraction result for a CNT grown surface after CNT growth in this example is shown in FIG. 3. It is known that when a titanium film is used, there is a TiC peak of titanium bound with carbon if the film is not oxidized, with the result that a low-resistance junction is provided. However, in this case TiC was not observed. FIG. 3 also shows a result when Ti oxidation was prevented by continuously producing a sputtered catalyst film on the Ti film. In this case, CNTs were formed and the presence of TiC was confirmed, although the diameters and the like of the CNTs were not adequately controlled. From this it is assumed that the aforementioned high resistance may have been due to the oxidation of Ti film.

Based on such assumptions, in the electrical connection structure of the present invention an electroconductive catalyst support layer is provided below the fine catalyst particle layer when forming the elongated carbon structures.

The fine catalyst particle layer of the present invention is preferably formed by depositing fine catalyst particles which have been made into fine particles in advance, on an electroconductive catalyst layer. That is, an electroconductive catalyst support layer is provided on an electroconductive body, fine catalyst particles which have been made into fine particles in advance are deposited on the electroconductive catalyst support layer to form a fine catalyst particle layer, and elongated carbon structures are provided on the fine catalyst particle layer. In this way it is possible to make the size of the fine catalyst particles uniform, making it easy to control CNT size and density.

Such a catalyst can be selected appropriately from known catalysts according to the elongated carbon structures to be used. Examples include metals selected from the group consisting of Co, Ni, Fe, Pd, Pt and alloys comprising these. When the elongated carbon structures are carbon nanotubes, Co, Ni or Fe or an alloy comprising these is particularly desirable.

There are no particular limits on the size of the fine catalyst particles, but for forming carbon nanotubes an average particle size in the range of 0.5 to 50 nm is desirable. This size can be measured by observation through an electron microscope. Considering that the carbon nanotubes grow around cores of the fine catalyst particles, the size and density (how many carbon nanotubes are present per specific area) of the carbon nanotubes in a via hole will be affected by the particle size and distribution density of the fine catalyst particles, for example. The desired density of carbon nanotubes depends on the diameter of the carbon nanotubes, but generally the higher the density the better. More specifically, $5 \times 10^{10}$ nanotubes/cm$^2$ or more is desirable. The size and distribution density of the fine catalyst particles is preferably determined so as to obtain such a size and density of the carbon nanotubes.

There are no particular limits on the method of depositing the fine catalyst particles, but examples include methods in which fine catalyst particles are formed by some means and classified as necessary to standardize the particle size, and these fine catalyst particles are then deposited on an electroconductive catalyst support layer. Since the elongated carbon structures of the present invention grow around cores of fine catalyst particles, a uniform particle size is important for controlling the diameter and formation positions of the elongated carbon structures. In general the particles are preferably distributed and deposited uniformly on the electroconductive catalyst support layer.

The fine catalyst particles can be formed by appropriately selecting a known method such as laser ablation, evaporation/condensation or the like. As a method of depositing fine catalyst particles which have been made into fine particles in advance, spraying or the like of charged or uncharged particles is adequate if the area on which the fine catalyst particles are to be deposited is large enough. However, if the aspect ratio is as high as 1/1 or higher as in the case of the base of a via hole, a method of bombarding the electroconductive catalyst support layer with a directionally-aligned fine particle beam under a reduced pressure is preferred (see Japanese Patent Application Laid-open No. 2005-022885 (Claims)). A differential mobility analyzer (DMA), impactor or the like can be used for the classification.

The electroconductive catalyst support layer of the present invention means a layer having electroconductivity on which a fine catalyst particle layer for producing elongated carbon structures is or has been deposited.

The fine catalyst particle layer is deposited on the electroconductive catalyst support layer before the elongated carbon structures are formed. However, it is known that in some cases fine catalyst particles move (for example to the tips of the elongated carbon structures) as the elongated carbon structures are formed. Moreover, even when the fine catalyst particles are at the roots of carbon nanotubes, if a metal carbide such as TiC is produced as described above, direct contact may occur between the electroconductive catalyst support layer and the carbon nanotubes. This is what is meant by the above "a . . . layer on which a fine catalyst particle layer . . . is or has been deposited".

"Having electroconductivity" means not that a substance having electroconductivity is used, but that, for example, when a via is formed using elongate carbon structures of the present invention, a resistance value at or below a desired resistance value is obtained.

Electroconductivity with the electroconductive body is not particularly a problem, but in some cases electroconductivity with the elongated carbon structures may be adversely affected by oxidation or the like depending on the substance which makes up the electroconductive catalyst support layer, and this should be taken into consideration when selecting a substance which makes up the electroconductive catalyst support layer. From this standpoint an oxidation-resistant substance or in other words a substance the electroconductivity of which is not lost or diminished due to oxidation can be preferably used for the electroconductive catalyst support layer of the present invention when manufacturing the electrical connection structure of the present invention.

The aforementioned desired resistance value can be arbitrarily set depending on the use. Specifically, when carbon nanotubes are formed at a density of $5 \times 10^{10}$ nanotubes/cm$^2$ in a via hole of a diameter of 2 µm and a thickness of 350 nm, a resistance value of 5Ω or less is preferred and a resistance value of 1Ω or less is more preferred.

The electroconductive catalyst support layer of the present invention preferably has a function of promoting growth of the elongated carbon structures. The elongated carbon structures are produced by the catalytic effect of the fine catalyst particles, but are also affected by the electroconductive catalyst support layer, and appropriate material selection is vital because there are cases in which elongated carbon structures are not produced at all or in which they are produced but the size and density thereof are difficult to control. Of course, the function of promoting growth of the elongated carbon structures can be lost once the elongated carbon structures have grown to the desired length.

In addition to the aforementioned functions, this electroconductive catalyst support layer preferably has a function of preventing diffusion of a metal making up the underlying electroconductive layer. When the electroconductive catalyst support layer has such a function it can retain its original function as an electroconductive catalyst support layer while at the same time preventing functional deterioration of the electrical connection structure due to diffusion of the electroconductive layer.

This electroconductive catalyst support layer may consist of one layer or of multiple layers. Consequently, the aforementioned functions may all be provided in a single layer or the functions may be assigned to different layers. Specifically, in the latter case, the electroconductive catalyst support layer may have a structure comprising a first layer on the side of the electroconductive body which has a function of preventing diffusion of a metal making up the electroconductive body and a second layer on the side of the fine catalyst particle layer which has a function of promoting growth of the elongated carbon structures. There may also be another layer between the first and second layers.

This electroconductive catalyst support layer is preferably a HfN film layer, ZrN film layer or TiN film layer or a multilayer film thereof. "A multilayer film of these" may be either a multilayer film of these alone or a combination of one or more of these and a layer consisting of another material.

Figure 4:
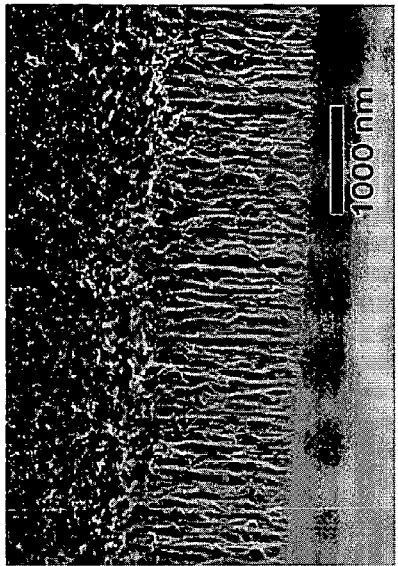
FIG. 4 shows photographs of scanning electron microscope images of CNTs grown from fine Co particles with an average diameter of 5 nm deposited on a HfN film, a TiN film, an Si substrate and an Mo film.
Figure 4:
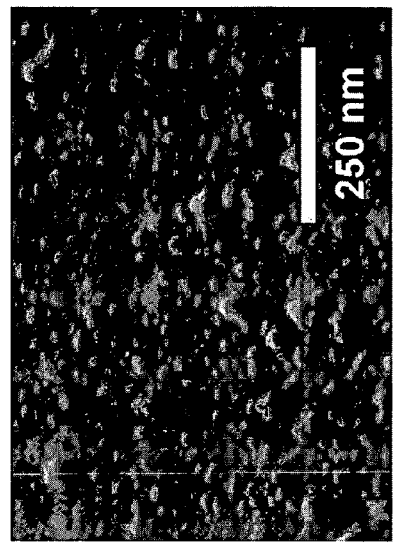
Figure 4:
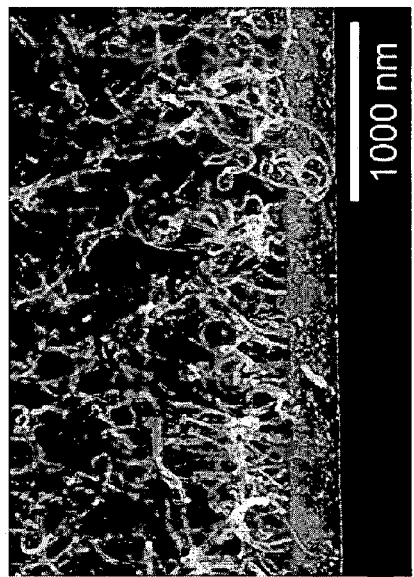
Figure 4:
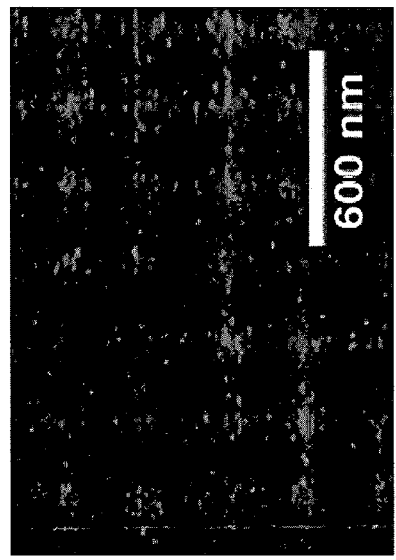

It is known that these films resist oxidation when exposed to air. For example, FIG. 4 shows scanning electron microscope images of CNTs grown from fine Co particles with an average diameter of 5 nm deposited on (a) a HfN film, (b) a TiN film, (c) a Si substrate and (d) a Mo film. The CNT growth temperature was about 600° C., and the raw material gas was a mixed acetylene-argon gas. As shown in FIG. 4, under these conditions there is almost no CNT growth on the Si substrate or Mo film, but good CNT growth on the HfN and TiN films. Thus, HfN, ZrN and TiN films are films which promote CNT growth. As discussed above, these films are known to be highly oxidation-resistant, and are desirable as electrode materials for CNT wiring.

HfN film, ZrN film and TiN film layers can be used as single layers having the function of preventing diffusion of a metal making up the electroconductive layer as well as other functions in combination, but in many cases they are preferably used, on the side of the electroconductive body, as part of a layered structure having a layer which has a function of preventing diffusion of a metal making up the electroconductive layer. In this case, any known material for preventing metal diffusion can be used as the first layer on the side of the electroconductive body, and preferably a Ta layer is used.

There are no specific limitations on the thickness of the electroconductive catalyst support layer in the present invention, although when the function of preventing diffusion is combined, a thickness in the range of 1 to 50 nm is typical. There are no specific limitations on how the electroconductive catalyst support layer is prepared in the present invention, and vacuum evaporation method, sputtering, CVD and the like can be employed.

"Elongated carbon structures" in the present invention typically include carbon nanotubes, but may also be of another size or form as long as they are electroconductive bodies having an elongated shape and mainly consisting of carbon.

Carbon nanotubes include those having a band structure which fulfills the conditions for exhibiting metallic properties, and those having a band structure which fulfills the conditions for exhibiting semi-electroconductive (semi-metallic) properties. The carbon nanotubes of the present invention preferably exhibit metallic properties.

A low-resistance electrical connection structure can be provided through the use of the elongated carbon structures of the present invention. It is also possible to improve resistance to migration, which is a cause of disconnection. Moreover, the elongated carbon structures of the present invention are useful for high aspect ratios, as in the case of via holes.

For example when aluminum or copper is used to fill a via hole, the problem of movement of metal atoms of the wiring material (also known as migration) is known to occur. This is a disconnection phenomenon caused by stress on the electroconductive material or electrons flowing through the wiring, and is particularly likely to occur in wiring or via parts which necessarily have complex structures. Migration due to stress is called stress migration, while that due to movement of electrons through the wiring is called electromigration. Migration resistance is closely related to the heat radiation properties of an electroconductive material, and it is known that migration resistance declines when heat radiation is poor and the temperature of an electroconductive material rises.

By contrast, when carbon nanotubes are used to fill a via hole, for example, they are highly resistant to stress migration because of their excellent mechanical strength, and are highly resistant to electromigration because the strong bonds between carbon atoms makes the movement of atoms difficult to occur. Heat radiation is also good because carbon nanotubes have good thermal conductivity.

These elongated carbon structures are useful for high aspect ratios as in the case of via holes because they can be formed by self-assembling on a fine catalyst particle layer and are therefor resistant to the effect of aspect ratio, and because the cylindrical diameter of carbon nanotubes is about 0.5 to about 50 nm so that several hundreds or more of carbon nanotubes can be vertically packed, for example, in a via hole with a diameter of 2 μm, among other reasons.

There are no particular limits on the material forming the wall of the via hole. For example, a silicon insulating material such as silicon oxide can be used. It may also be porous. Of course, it may also be a material with a low dielectric constant.

Arc discharge or laser ablation has conventionally been used for forming carbon nanotubes, but currently plasma CVD and thermal CVD are commonly used. Methods of formation by CVD are expected to be applicable to integrated circuits because they can form nanotubes directly on substrates.

The nanotubes of the present invention can also be formed as so-called peapod structure nanotubes in which nano-structures which are different from the nanotubes and which exhibit metallic properties as a whole, such as metal-containing fullerenes, are encapsulated in the carbon nanotubes.

Using nanotubes with such a peapod structure comprising other nano-structures allows the electroconductivity or mechanical strength of the via to be strengthened. For example, in the case of carbon nanotubes comprising metal-containing fullerenes it is known from the first principal calculations that the electrical charge of the enclosed metal appears on the outside of the fullerenes and even on the outside of the nanotubes, thus enhancing the electrical conductive properties of the via.

Structures which are different from the nanotubes, molecules or atoms which exhibit metallic properties as a whole such as metal-containing fullerenes may also be present between adjacent nanotubes making up a single via rather than within the nanotubes. It is also possible to position the aforementioned structures different from nanotubes, or molecules or atoms, between adjacent nanotubes which encapsulate metal-containing fullerenes.

In this way, the electrical connection structure of the present invention can be used in a semiconductor integrated circuit device. In this case a highly reliable, highly integrated semiconductor integrated circuit device can be achieved.

Figure 6:
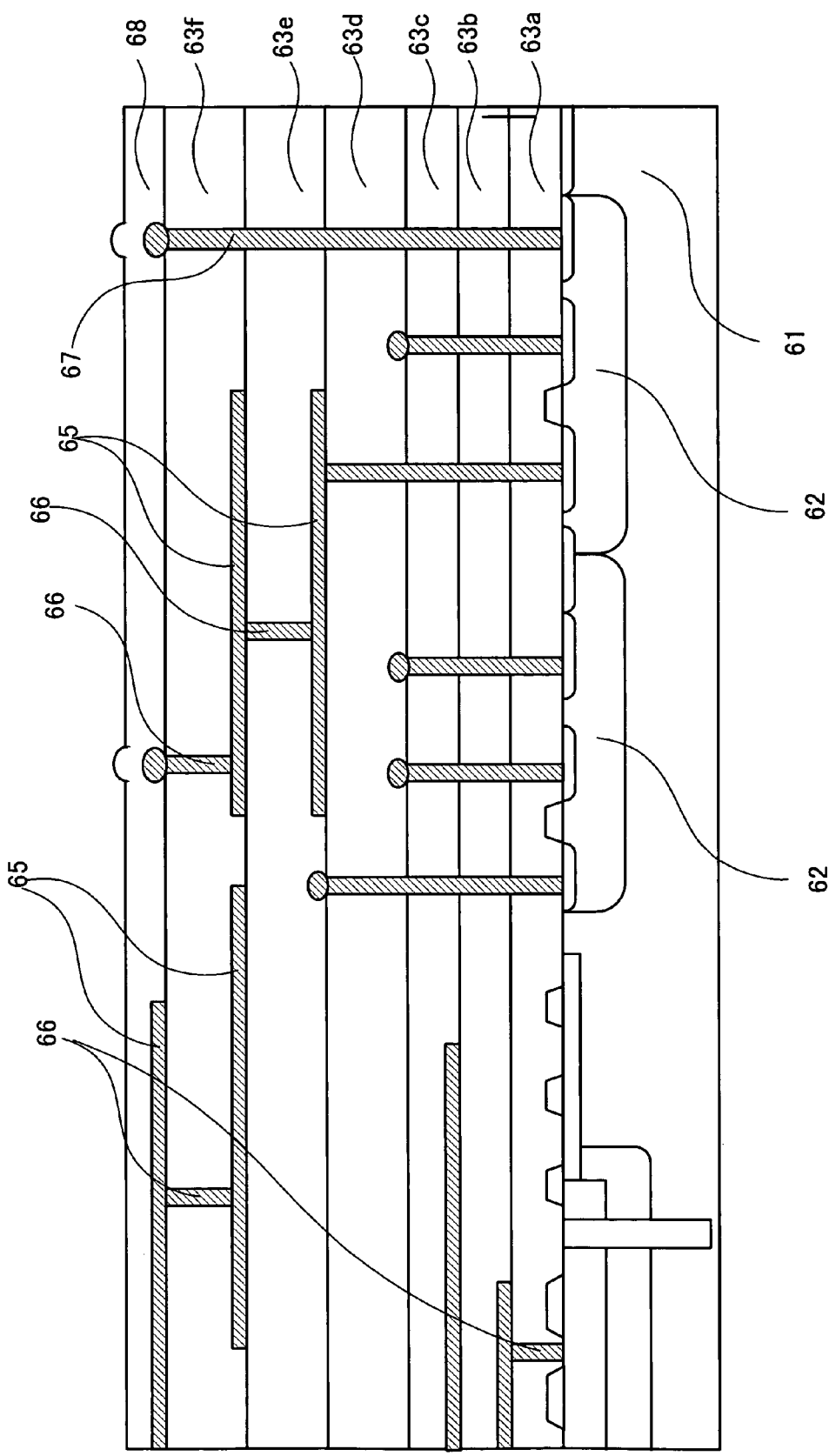
FIG. 6 is a model cross-section showing a semiconductor integrated circuit device using an electrical connection structure of the present invention.

FIG. 6 shows a model view in cross-section of a semiconductor integrated circuit device using an electrical connection structure of the present invention. Multiple insulating layers (interlayer insulating films) 63a through 63f are formed covering transistors 62 or other elements which are embedded in a silicon substrate 61. Wiring layers are sandwiching the insulating layers, and a wire 65 of a specific wiring layer is connected to a wire 65 of another layer by means of a via 66, which is formed so as to pass through an insulating layer. 67 represents contacts connecting wires 65 between elements. The uppermost wiring layer is covered by a protective layer 68. In the integrated circuit device shown in this figure the electrical connection structure of the present invention can be applied to vias 66.

EXAMPLE

Figure 5A:
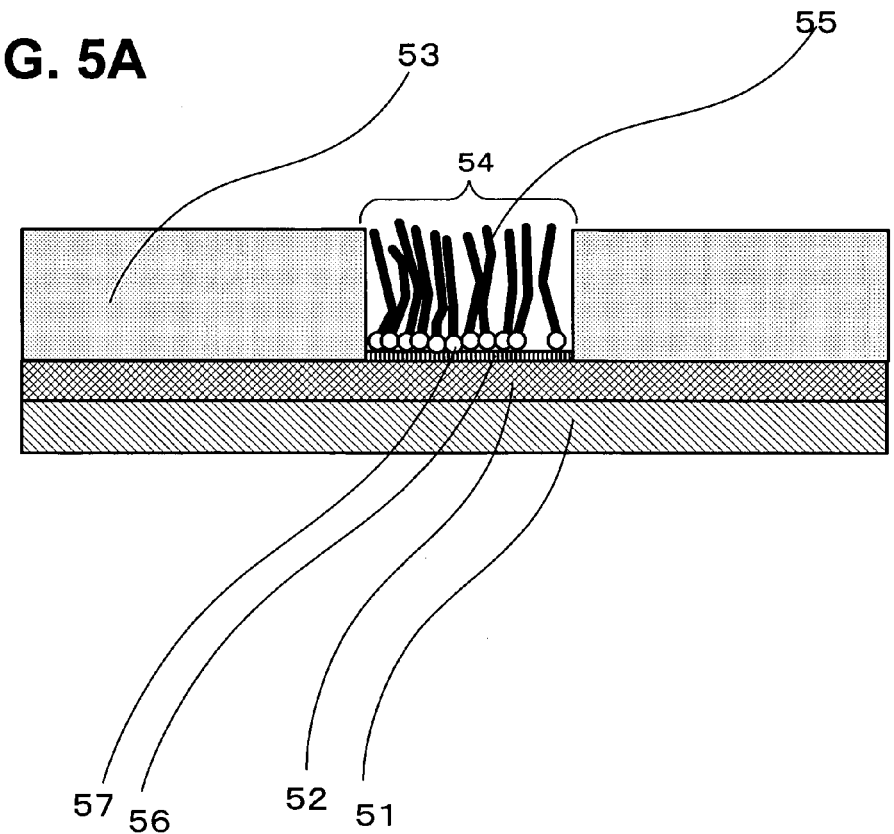
FIG. 5A is a cross-section showing one example of a CNT via structure obtained by the example.

An example of the present invention is explained next. FIG. 5A shows one example of a CNT via structure obtained with this example. FIG. 5A is a model side cross-sectional view of an electrical connection structure showing how a via hole 54 is provided in a multilayer structure in which a Ta film 52 for preventing diffusion is formed with a thickness of 5 nm on a copper wiring layer 51, an $SiO_2$ insulating layer 53 is formed with a thickness of 350 nm thereon, and CNTs 55 are formed in the via hole 54 perpendicular to the underlying layers. The copper wiring layer 51 corresponds to the electroconductive body of the present invention. The Ta film 52 is a copper diffusion prevention layer.

A TiN film 56 with a thickness of 5 nm is formed on the Ta film 52 at the bottom of the via hole 54, fine Co particles 57 with an average diameter of 5 nm are formed on the TiN film 56, and CNTs 55 grow from these fine catalyst particles. The image of CNTs 55 growing from the fine Co particles is a conceptual one. The TiN film 56 corresponds to the electroconductive catalyst support layer of the present invention, the layer of fine particles 57 corresponds to the fine catalyst particle layer of the present invention, and the CNTs 55 correspond to the elongated carbon structures of the present invention. It is also possible to consider the Ta film 52+TiN film 56 as the electroconductive catalyst support layer of the present invention.

In FIG. 5A the fine catalyst particles are present at the bases of the CNTs, but as discussed above, the fine catalyst particles could also be at the tips of the CNTs or incorporated into the structures of the CNTs. The tips of the CNTs can also be treated by oxygen plasma ashing to remove the fine catalyst particles or to remove weakly-bound 5-member ring structure parts. CMP (chemical mechanical polishing) can be applied to flatten the tops of the CNTs. Upper copper wiring can also be connected to this via, although this is not shown in FIG. 5A.

Figure 5B:
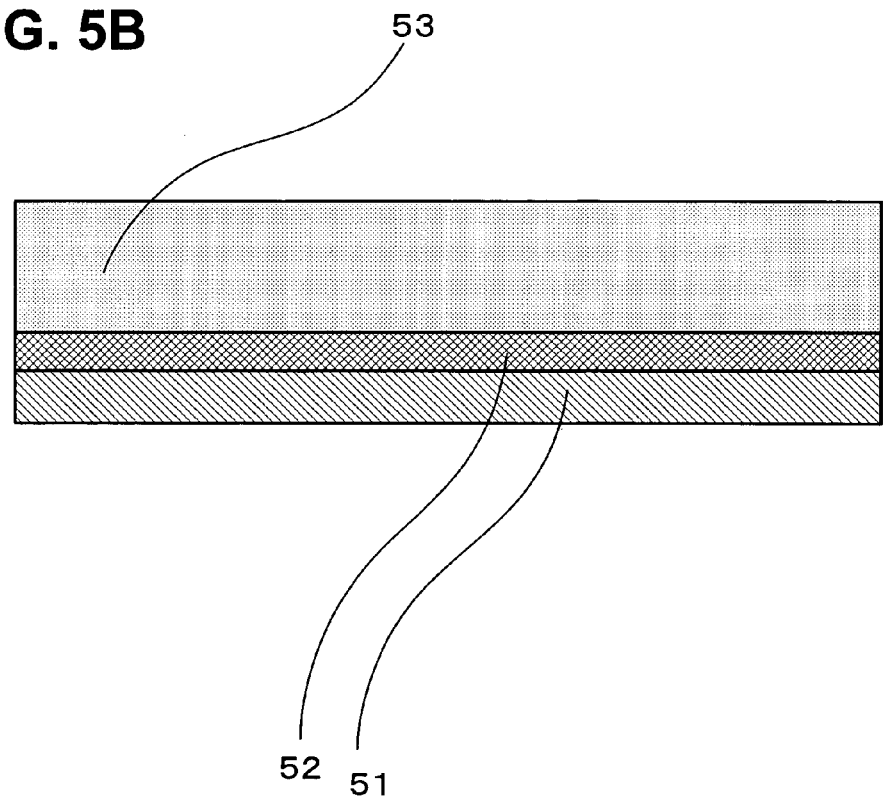
FIG. 5B is a cross-section showing a CNT via structure obtained by the example during preparation.

A method of preparing such a CNT via is explained below. First, the lower copper wiring 51 was deposited by sputtering. Plating can be adopted instead of sputtering. The Ta film 52 was deposited thereon to a thickness of 5 nm by sputtering. Then, the $SiO_2$ film 53 was deposited with a thickness of 350 nm by TEOS(tetraethoxysilane)-CVD. The cross-sectional structure shown in FIG. 5B was obtained in this way.

Figure 5C:
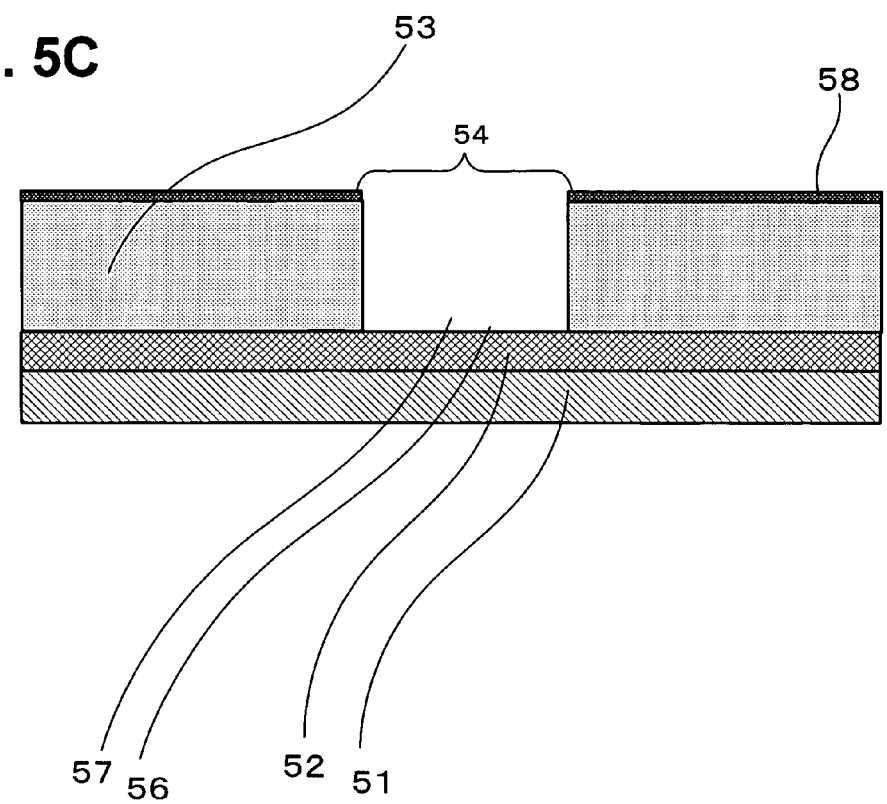
FIG. 5C is a cross-section showing a CNT via structure obtained by the example during preparation.

Next, a photoresist was applied to the top of the $SiO_2$ film 53, the photoresist was removed from the intended site of the via hole 54 by photolithography, and the via hole 54 was then opened in the $SiO_2$ film 53 by dry etching using fluorine. Wet etching or the like using hydrofluoric acid can be used instead of dry etching. In this way, the cross-sectional structure of FIG. 5C was obtained. Photoresist layer 58 remains on the top of the $SiO_2$ oxide layer 53.

Figure 7:
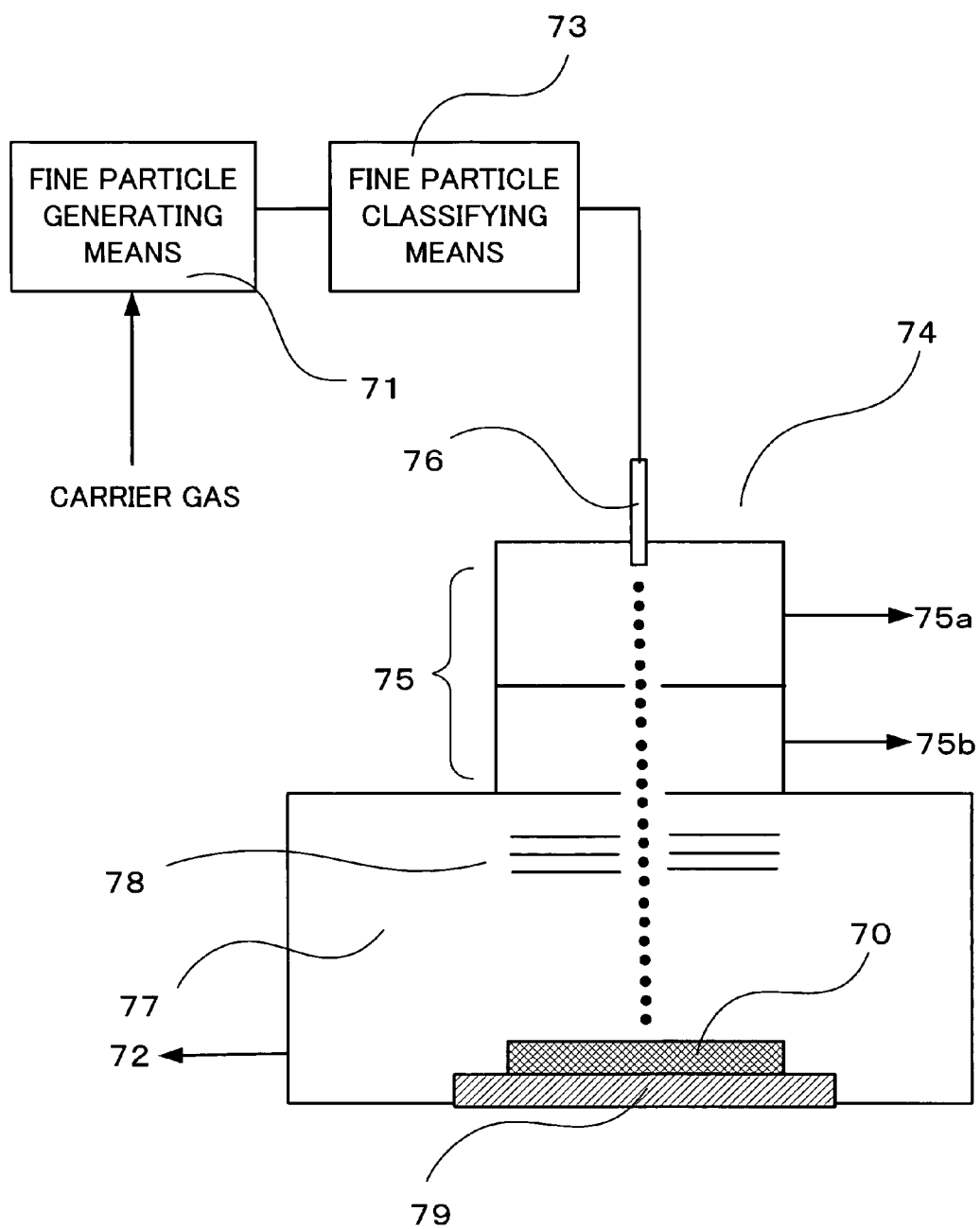
FIG. 7 is a model view showing a deposition device which can be used in preparing a fine catalyst particle layer of the present invention.

Next, the TiN film 56 was deposited by sputtering to 5 nm on the entire substrate, and the Co particles 57 with an average diameter of 5 nm were deposited thereupon by the method described in Japanese Patent Application Laid-open No. 2005-022885 (Claims). Specifically, a deposition device such as shown in FIG. 7 was used.

With this deposition device, in a vacuum the surface of the aforementioned electroconductive catalyst support layer is irradiated with a beam of fine catalyst particles with a uniform particle size to form the aforementioned fine catalyst particle layer. This method is suited to formation of the fine catalyst particle layer of the present invention.

This deposition device is operated as follows. The deposition device is constructed with a fine particle generating means 71, a fine particle classifying means 73 for classifying fine particles into a specific size, and a deposition chamber 74 for emitting the fine particle beam and depositing the fine particles.

The deposition chamber 74 has a differential evacuation part 75 and a high vacuum part 77 (pressure about $10^{-3}$ Pa for example), and is provided with a fine particle converging part 78 for aligning the direction of the fine particle beam and a movable stage 79 on which is mounted a substrate 70 which is to be irradiated with the beam.

The fine particle generating means 71 uses laser ablation or evaporation/condensation for example to generate fine particles, which are then sorted (classified) according to the size as necessary by the classifying means 73 using a differential mobility analyzer (DMA) or the like for example, and introduced into the deposition chamber 74 together with a carrier gas. In this example a differential mobility analyzer (DMA) was used as the classifying means.

The carrier gas containing the fine particles is passed through a nozzle 76 to the deposition chamber 74. The nozzle 76 has a small hole (orifice) or capillary. In this example, an orifice was used.

Fine particles introduced into the deposition chamber 74 are passed to the high vacuum part 77 via a single-stage or multi-stage differential evacuation part 75. In this example, the part 75 was a 2-stage differential evacuation part, with pressures maintained at about 70 Pa and 0.1 Pa in the respective stages. At this time, the carrier gas alone is passed to the 2-stage differential evacuation pumps 75a and 75b utilizing the inertia of the fine particles. The high vacuum part 77 is maintained at a high vacuum (such as $10^{-3}$ Pa) by a pump 72. Fine particles passed to the high vacuum part 77 have some spreading from the effect of the carrier gas. Such fine particles are next passed to the fine particle converging part 78 (an electrostatic lens for example) and directionally aligned by this converging effect to form a fine particle beam.

The highly-directional fine particle beam that has been directionally aligned is irradiated onto the substrate 70, which is fixed on the movable stage 79 and has groove structures formed with a high aspect ratio. Because of the high vacuum there is little disturbance from gas molecules. As a result, the fine particles generally maintain the direction provided by the fine particle converging part 78, and are deposited substantially on the bottoms of the high-aspect-ratio groove structures.

Figure 5D:
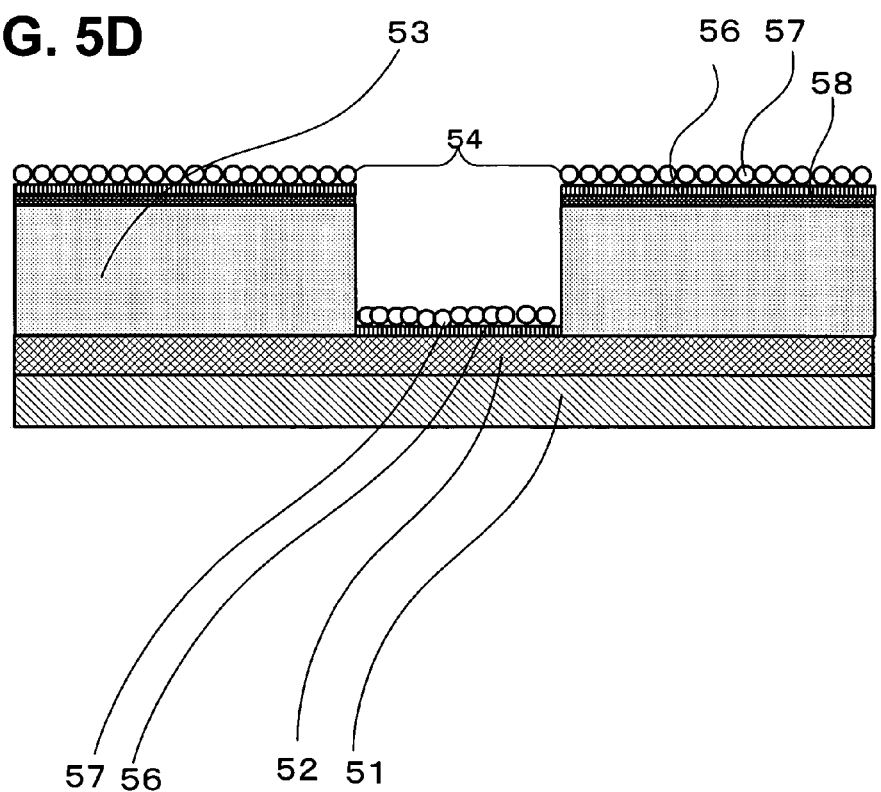
FIG. 5D is a cross-section showing a CNT via structure obtained by the example during preparation.

The cross-sectional structure of FIG. 5D was obtained in this way. This TiN film 56 can also be deposited continuously during deposition of the aforementioned Ta film.

Figure 5E:
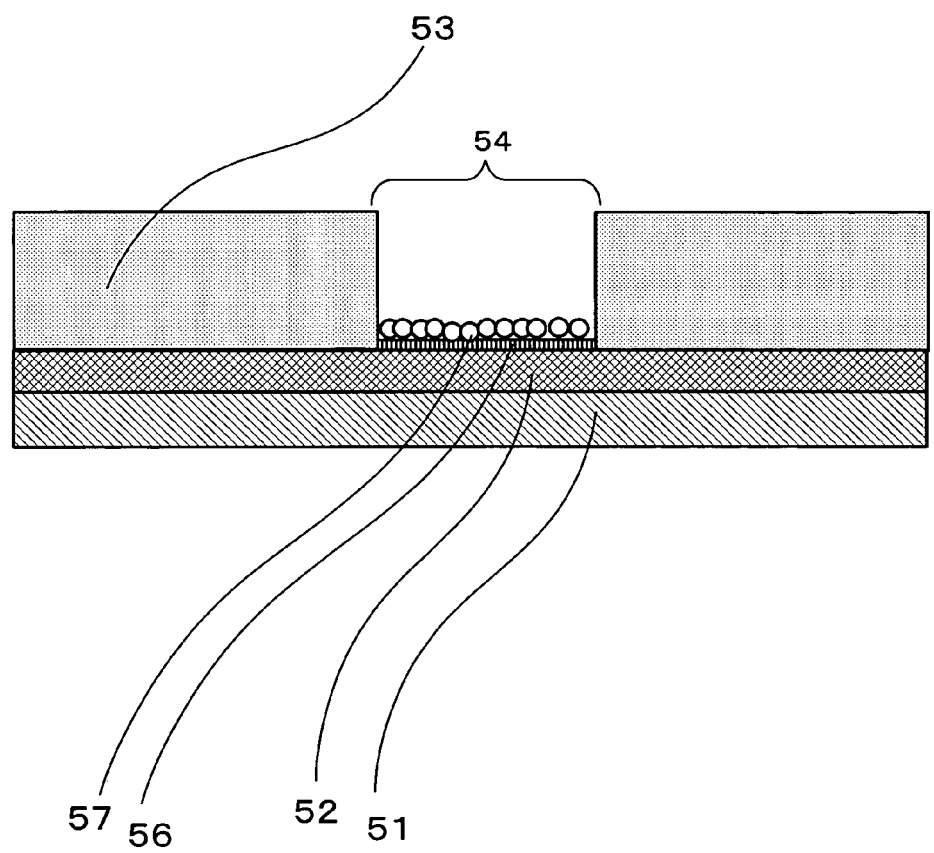
FIG. 5E is a cross-section showing a CNT via structure obtained by the example during preparation.

Next, the TiN film and fine Co particles outside the bottom of the via hole were removed by the lift-off method. The cross-sectional structure of FIG. 5E was obtained in this way.

Figure 8:
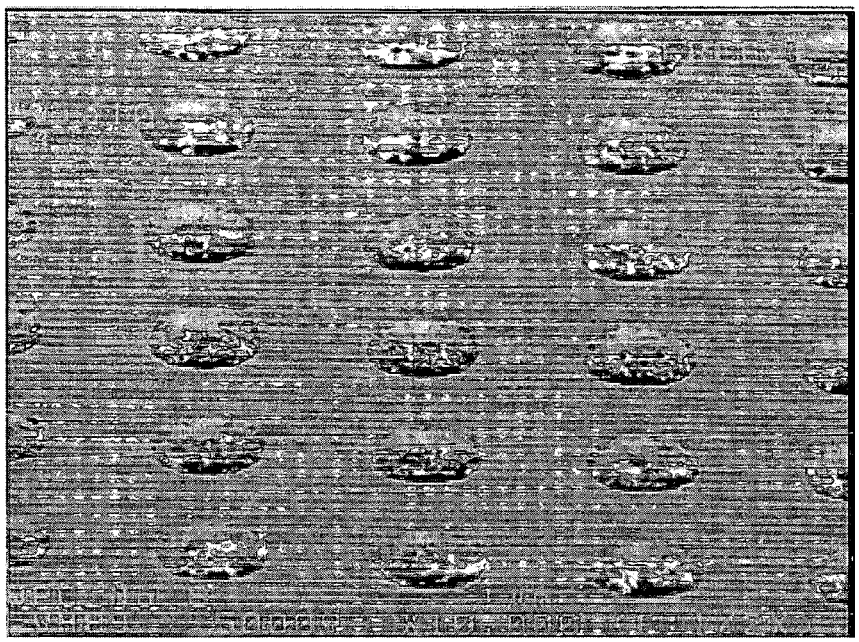
FIG. 8 is an SEM photography showing an electrical connection structure peeking out through a via hole immediately after CNT growth.
Figure 8:

An electrical connection structure prepared with via holes in this way was transported to the CVD chamber and CNTs were grown in the via holes by thermal CVD. In this example, a mixed acetylene-argon gas (volume ratio 1:9) was used as the raw material gas. The pressure and flow rate of the gas were 1 kPa and 200 sccm (standard cubic centimeter per minute), and the growth temperature was 510° C. The structure of FIG. 5A was obtained as a result. In this example, a metal electrode was formed on the top of the CNT bundle after CNT growth, and the resistance of the CNT vias was measured. FIG. 8 is an SEM image showing the electrical connection structures peeking out through the via holes immediately after the aforementioned CNT growth (bottom image is an enlargement of the top image).

The resistance of a single 2 μm-diameter via was about 1 ohm as calculated from the measurement of the resistance of a via chain consisting of a line of 1000 CNT vias prepared in this way. As expected, this showed that the electrical contact structure of the present invention has a low resistance. Similar results were obtained when an HfN film or a ZrN film was used.

What is claimed is:
1. An electrical connection structure comprising elongated carbon structures electrically connected to an electroconductive body on a substrate, and further comprising:
    a substrate with the electroconductive body disposed thereon;
    an electroconductive catalyst support layer in direct contact with the electroconductive body and over the substrate; and
    a fine catalyst particle layer for producing the elongated carbon structures, in direct contact with the electroconductive catalyst support layer, wherein the electroconductive catalyst support layer, the fine catalyst particle layer, and the elongated carbon structures are layered successively on the electroconductive body; and wherein said fine catalyst particle layer on the eleetroconductive catalyst support layer, consists of deposited, classified fine catalyst particles which have been made into fine particles and classified before the deposition, wherein the classified fine catalyst particles have an average particle size in the range of 0.5 to 50 nm with a distribution density of $5 \times 10^{10}$ elongated carbon structures/cm$^2$ or more;

wherein said electroconductive catalyst support layer comprises a diffusion-preventing layer on the side of the electroconductive body, the diffusion-preventing layer being a Ta layer, and having a function of preventing diffusion of a metal making up said electroconductive body, and an elongated carbon structure-growing layer on the side of said fine catalyst particle layer, the elongated carbon structure-growing layer having a function of promoting growth of the elongated carbon structures, wherein said elongated carbon structures are disposed in a via, hole, said elongated carbon structures are elongated in a direction perpendicular to the substrate, and said elongated carbon structure-growing layer is made of at least one oxidation-resistant substance selected from the group consisting of TiN, HfN, ZrN, and a combination thereof.

2. The electrical connection structure according to claim 1, wherein said electroconductive catalyst support layer has a function of promoting growth of the elongated carbon structures.

3. The electrical connection structure according to claim 1, wherein said electroconductive catalyst support layer has a function of preventing diffusion of a metal making up said electroconductive body.

4. The electrical connection structure according to claim 1, wherein said classified fine catalyst particles are fine particles of a metal selected from the group consisting of Co, Ni, Fe, Pd, Pt and alloys thereof.

5. The electrical connection structure according to claim 1, wherein said elongated carbon structure-growing layer of the electroconductive catalyst support layer is a HfN film layer, a ZrN film layer, or a multilayer thereof.

6. The electrical connection structure according to claim 1, wherein the classified fine catalyst particles have a uniform particle size.

7. The electrical connection structure according to claim 1, wherein the classified fine catalyst particles are classified so as to standardize the classified fine catalyst particles.

8. The electrical connection structure according to claim 7, wherein the classified fine catalyst particles are sorted to standardize a size of the classified fine catalyst particles.

9. The electrical connection structure according to claim 1, wherein the fine catalyst particle layer is in direct contact with the elongated carbon structure-growing layer.

10. The electrical connection structure according to claim 1, wherein said elongated carbon structure-growing layer consists of HfN or ZrN.

11. The electrical connection structure according to claim 1, wherein the classified fine catalyst particles are of a standardized specific size within the range of 05 to 50 nm.

* * * * *